United States Patent [19]

Susaki et al.

[11] 4,166,278
[45] Aug. 28, 1979

[54] SEMICONDUCTOR INJECTION LASER DEVICE

[75] Inventors: Wataru Susaki; Hirofumi Namizaki, both of Amagasaki, Japan

[73] Assignee: Mitsubishi Denki Kabushiki Kaisha, Tokyo, Japan

[21] Appl. No.: 892,406

[22] Filed: Mar. 29, 1978

[51] Int. Cl.² ............................................. H01L 33/19
[52] U.S. Cl. ..................................... 357/18; 357/17; 331/94.5 H
[58] Field of Search ............... 357/18, 17; 331/94.5 H

[56] References Cited

U.S. PATENT DOCUMENTS

| 3,961,996 | 6/1976 | Namizaki | 148/171 |
| 3,990,096 | 11/1976 | Namizaki | 357/18 |
| 4,065,729 | 12/1977 | Gover | 331/94.5 H |

Primary Examiner—Martin H. Edlow
Attorney, Agent, or Firm—Wenderoth, Lind & Ponack

[57] ABSTRACT

N type CaAlAs, GaAs and GaAlAs layers are successively grown on a semi-insulating GaAs substrate doped with Cr to form a semiconductor chip. Predetermined portions of those layers are selectively etched away to a depth reaching the substrate. Then a P type GaAlAs layer is epitaxially grown on the etched portions to restore the original shape of the chip. The chip is heated to form a pn junction in at least the GaAs layer serving as a light emitting region.

5 Claims, 3 Drawing Figures

SEMICONDUCTOR INJECTION LASER DEVICE

BACKGROUND OF THE INVENTION

This invention relates to a semiconduction injection laser device having a low threshold current and a small change in threshold current due to a variation in temperature.

There have been well known several structures of semiconductor injection lasers in which the threshold current is decreased. Among them a laser structure known as the so-called transverse junction stripe (which is abbreviated to "TJS") laser is particularly excellent. That TJS laser oscillates in the single mode and the characteristics thereof are described in detail, for example, in H. Namizaki article entitled "Transverse-Junction-Stripe Lasers with a GaAs p-n Homojunction," IEEE Journal of Quantum Electronics, QE-11, No. 7, 1975, pages 427–431. However, the TJS laser has been disadvantageous in that a leakage current not contributing to the laser oscillation is increased with an increase in current density and therefor a rise in temperature is attended with a rapid increase in the threshold current until the laser oscillation is ceased due to heat generated therein.

Also U.S. Pat. No. 3,961,996 to H. Namizaki et al. discloses a semiconductor injection laser having a two-dimensional hetero-structure including a double hetero-junction in a direction parallel to that PN homo-junction conducting the laser oscillation and a single hetero-junction in a direction perpendicular to the same PN junction to define an extremely small region by the hetero-junctions which region exhibits the effect of confining carriers and light therein whereby the laser can be operated with a low threshold current. The semiconductor injection laser disclosed in the cited patent has encountered the problems that an increase in temperature causes an abrupt increase in threshold current resulting form a leakage current flowing through a broad area of the junctions.

Accordingly it is a general object of the present invention to improve semiconductor injection laser devices.

It is an object of the present invention to provide a new and improved semiconductor injection laser device having an extremely low leakage current.

It is another object of the present invention to provide a novel semiconductor injection laser device improved in temperature dependency of a leakage current.

It is still another object of the present invention to provide a new and improved semiconductor injection laser device which has a decreased threshold current and a reduced rate of change thereof due to a temperature.

SUMMARY OF THE INVENTION

The present invention provides a semiconductor injection laser device comprising an electrically semi-insulating semiconductor substrate including a main face, a first, a second and a third semiconductor layers successively disposed on a predetermined portion of the main face of the semiconductor substrate, and a fourth semiconductor layer disposed on the remaining portion of the main face of the semiconductor substrate to contact the first, second and third semiconductor layers, the fourth semiconductor layer being substantially flush with the third semiconductor layer and extending into the semiconductor substrate, the fourth semiconductor layer having a first type conductivity, at least the second semiconductor layer consisting of a pair of semiconductor regions having the first type conductivity and a second type conductivity respectively to form therebetween a pn junction serving as a light emitting region, the second semiconductor layer having a forbidden band width narrower than forbidden band widths of the first, second and third semiconductor layers.

In a preferred embodiment of the present invention, the semiconductor substrate may be formed of high resistivity gallium arsenide (GaAs) doped with chromium (Cr). The first, second, third and fourth semiconductor layers may be formed of n type gallium aluminum arsenide (GaAlAs), n type gallium arsenide (GaAs), n type gallium-aluminum arsenide (GaAlAs) and p type gallium-aluminum arsenide (GaAlAs) respectively.

BRIEF DESCRIPTION OF THE DRAWING

The present invention will become more readily apparent from the following detailed description taken in conjunction with the accompanying drawing in which.

Throughout the Figures like reference numerals designate identical or similar components.

DESCRIPTION OF THE PREFERRED EMBODIMENTS

Figure 1:
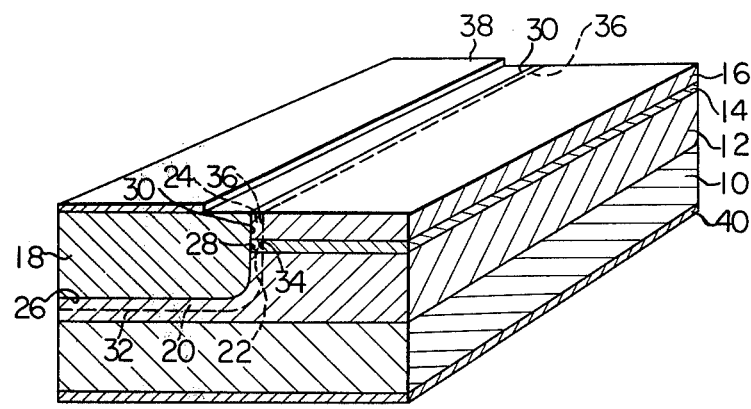
FIG. 1 is a perspective view of a semiconductor injection laser device constructed in accordance with the principles of the prior art.

Referring now to FIG. 1 of the drawing, there is illustrated a TJS laser device as above described. The arrangement illustrated comprises an n type gallium arsenide (GaAs) substrate 10, and an n type gallium-aluminum arsenide (GaAlAs) layer 12, an n type gallium arsenide (GaAlAs) layer 14; and an n type gallium-aluminum arsenide (GaAlAs) layer 16 successively formed on one of the main faces of the n type semiconductor substrate according to liquid epitaxial growth technique.

Then predetermined portions, in this case, the left-hand portions as viewed in FIG. 1 of the n type layers 12, 14 and 16 are removed as by etching while that portion of the lowermost layer 12 adjacent to the substrate 10 is left. Thereafter a liquid epitaxial growth technique is used to form a p type gallium-aluminum arsenide (GaAlAs) layer 18 on the removed portion of the n type layers 12, 14 and 16 to restore the original shape before the partial removal of the layers.

Subsequently the arrangement thus processed is thermally treated at an elevated temperature to cause a p type impurity included in the p type layer 18 to be diffused into the adjacent portions of the n type layers 12, 14 and 16 to invert the conductivity of those adjacent layer portions to a p type. That is, a p type GaAlAs region 20, a p type GaAs region 22 and a p type GaAlAs region 24 are formed on the adjacent portions of the n type GaAlAs, GaAs and GaAlAs layers 12, 14 and 16 respectively with those p type layers light doped with the p type impurity.

As a result, a pp homo-junction 26, a pp hetero-junction 28 and a pp homo-junction 30 are formed between the p type GaAlAs layer 18 and the p type GaAlAs region 20, between the p type GaAlAs layer 18 and the p type GaAs region 22, and between the p type GaAlAs layer 18 and the p type GaAlAs region 24 respectively while PN junctions 32, 34 and 36 are formed between the p type GaAlAs region 20 and the n type GaAlAs layer 12, between the p type GaAs region 22 and the n type GaAs layer 14 and between the p type GaAlAs region 24 and the n type GaAlAs layer 16 respectively. As shown in FIG. 1, the junctions 26, 28 and 30 are continuous to one another and the junctions 32, 34 and 36 are continuous to one another and substantially parallel to the former junctions 26, 28 and 30.

Thereafter, a first electrode 38 is disposed in ohmic contact with the p type GaAlAs layer 18 and a second electrode 40 is disposed in ohmic contact with the entire area of the other main face of the substrate 10.

Gallium arsenide (GaAs) is narrower in forbidden band-width than gallium-aluminum arsenide (GaAlAs) and therefore a pn junction with gallium arsenide can be rendered less in diffusion potential than PN junction with gallium-aluminum arsenide. As a result, the application of a forward voltage across the electrodes 38 and 40 permits a great portion of the resulting current to be concentrated on the pn junction 34 between the GaAs region and layer 22 and 14 respectively thereby to cause the laser oscillation in a light emission region which is at and adjacent to that pn junction 34 and forms an injection region.

However, although it can be said that the diffusion potential is high at the pn junction with gallium-aluminum arsenide, the current, although low, does flow over a barrier due to the diffusion potential. This current is abruptly increased attendant upon a rise in temperature and an increase in current density. For example, assuming that the gallium-alluminum arsenide $(Ga_{1-x}Al_xAs)$ includes aluminum in a concentration x of 0.4, densities of currents following through the pn junctions with gallium arsenide and gallium-aluminum arsenide respectively are in a ratio of about 1000 to 1 at room temperature with the currents approximating their threshold magnitudes.

On the other hand, the pn junction 34 with gallium arsenide has typically an area of $0.5 \times 300 \ \mu m^2$ while the pn junctions 32 and 36 with gallium-aluminum arsenide have typically the total area of about $50 \times 300 \ \mu m^2$. As a current is equal to a current density multiplied by an area, currents flowing through the pn junctions 32 and 36 with gallium-aluminum arsenide amount to about 10% of the total current. Of course, this current does not contribute to the laser oscillation.

A rise in temperature and an increase in current density is attended with a further change in ratio of current density while a leakage current is abrupty increased. Accordingly, a threshold current $I_{th}$ for laser oscillation is abruptly increased substantially following $I_{th} \propto T^7$ where T designates an absolute temperature. Eventually, the laser oscillation is ceased due to the generation of heat. In this connection, the threshold current $I_{th}$ may have the temperature dependency expressed by $I_{th} \propto T^3$ provided that a leakage current is negligible.

The present invention contemplates to eliminate the disadvantages of the prior art practice as above described.

Figure 2:
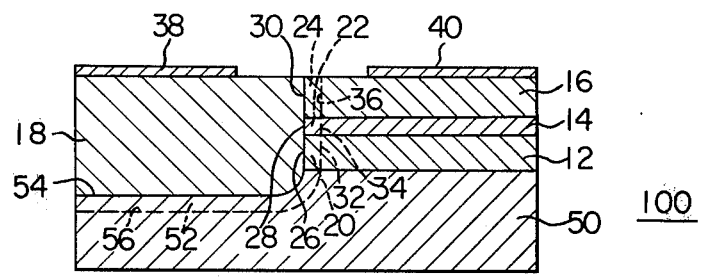
FIG. 2 is a cross sectional view of a semiconductor injection laser device constructed in accordance with the principles of the present invention.

Referring now to FIG. 2, there illustrated a semiconductor injection laser device constructed in accordance with the principles of the present invention. The arrangement illustrated comprises an electrically semi-insulating substrate 50 formed, for example, of a high resistivity gallium arsenide (GaAs) doped with chromium (Cr) or iron (Fe). The substrate 50 has normally a resistivity as high as from $10^4$ to $10^6$ ohms-centimeter and a thickness of about 70 microns.

As in the arrangement of FIG. 1, a liquid epitaxial growth technique or the like is used to grow an n type gallium-aluminum arsenide (GaAlAs) layer 12 on one of the main faces of the substrate 50 to a thickness of from 3 to 6 microns, and then to grow an n type gallium arsenide (GaAs) layer 14 on the n type layer 12 to a thickness of about 0.3 micron. Finally an n type gallium-aluminum arsenide (GaAlAs) layer 16 is expitaxially grown on the n type layer 14 to a thickness of about 2 microns. The n type layers 12, 14 and 16 have impurity concentrations of about $2 \times 10^{17}$, $1.5 \times 10^{18}$ and $2 \times 10^{17}$ atoms per cubic centimeter respectively.

A semiconductor chip thus formed has a dimension of about $300 \times 300$ microns and is generally designated by the reference numeral 100.

As in the arrangement of FIG. 1, the semiconductor chip 100 is selectively etched away from a predetermined portion, in this case, the lefthand portion of the exposed surface of the n type uppermost layer 16 and to a depth reaching the substrate 50. Then a liquid epitaxial growth technique is used to form a p type gallium-aluminum arsenide (GaAlAs) layer 18 on the etched portion to restore the original shape of the chip 100. The layer 18 is relatively heavily doped with zinc (Zn) to have an impurity concentration of from $1 \times 10^{18}$ to $1 \times 10^{19}$ atoms per cubic centimeter. The layer 18 is shown in FIG. 2 as having a lateral dimension or a width substantially equal to one half that of the chip 100 but the width thereof is sufficient to be about 50 microns.

Following this, the chip 100 is thermally treated at an elevated temperature to diffuse the zinc from the p type layer 18 into those semiconductor portions contacting the latter to form p type regions 52, 20, 22 and 24 in the diffused portions of the substrate 50 and the n type layers 12, 14 and 16 respectively as in the arrangement of FIG. 1.

Thus it is seen that, in addition to the pp homo-junction 26, the pp hetero-junction 28, the pp homo-junction 30 and the pn junctions 32, 34 and 36 as above described in conjunction with FIG. 1, a pp hetero-junction 54 and a pi junction 56 are formed between the p type GaAlAs layer 18 and the p type GaAs region 52 and the p type GaAs region 52 and the substrate 50 respectively. It is noted that in FIG. 2, the junctions 26 and 32 have equal areas as determined by the thickness of the n type layers 12 and 16 very small as compared with the arrangement of FIG. 1.

Subsequently a pair of first and second electrode 38 and 40 are disposed in ohmic contact with the p and n type gallium-aluminum arsenide layers 18 and 16 respectively according to vacuum evaporation or electroplating technique to complete the semiconductor injection laser device.

Figure 3:
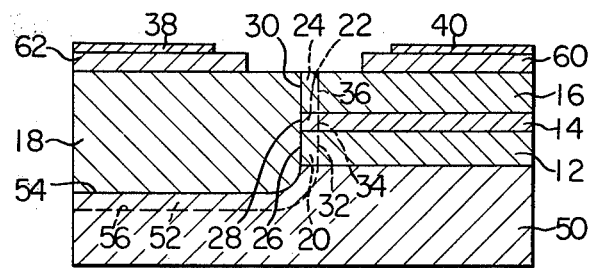
FIG. 3 is a view similar to FIG. 2 but illustrating a modification of the present invention.

FIG. 3 shows a modification of the present invention. The arrangement illustrated is different from that shown in FIG. 2 only in that in FIG. 3, an n and a p type gallium arsenide layer 60 and 62 respectively are selectively grown on the exposed surfaces of the n and p type gallium-aluminum arsenide layers 16 and 18 respectively as by liquid epitaxial growth technique and the electrodes 38 and 40 are disposed in ohmic contact with the p and n type gallium arsenide layers 60 and 62 respectively. This is because the direct contacting of an electrode with a gallium-aluminum arsenide layer renders a contact resistance therebetween high. In order to prevent a leakage current, the n and p type gallium arsenide layers 60 and 62 are spaced away from each other.

From the foregoing it is seen that the semiconductor injection laser device of the present invention is different from conventional devices in that in the present invention, the n type gallium arsenide (GaAs) substrate previously employed is replaced by an electrically semi-insulating substrate formed of high resistivity gallium arsenide doped with chromium (Cr) and liquid epitaxial growth technique is used to selectively grow a p type gallium-aluminum arsenide layer so as to contact the electrically semi-insulating gallium arsenide substrate. Therefore the resulting pn junctions 32 and 36 have the total area as determined by the thickness of the n type gallium-aluminum arsenide layers 12 and 16. Since this thickness can readily decreased to the order of about 1 μm, the present invention can make typically the total area of the pn junctions 32 and 36 equal to one fiftieth that previously provided or less. Also no current flows through the pp hetero-junction 54 because the pi junction 56 is formed within the electrically semi-insulating substrate 50 adjacent thereto. As a result, the current can be concentrated on the pn junction 34 and therefore it is possible to make a leakage current substantially negligibly low. Thus the threshold current is decreased and the temperature dependency thereof can be small as compared with the prior art devices. Further a leakage current can typically reduce to about one hundredth that flowing through conventional devices. In addition, the present invention has the good characteristics in that the threshold current $I_{th}$ for laser oscillation varies with a temperature T up to about 80° C. so as to follow $I_{th} \propto T^3$.

Also the lightly doped p type gallium arsenide layer 22 as above described serves to impart a difference in impurity concentration to p type region forming one side of the pn junction 34 thereby to cause a difference in index of refraction in that p type region. This difference in the index of refraction results in a further improvement in the oscillation mode.

While the present invention has been illustrated and described in conjunction with a few preferred embodiments thereof it is to be understood that numerous changes and modifications may be resorted to without departing from the spirit and scope of the present invention. For example, while the present invention has been described in terms of two semiconductive materials, that is, gallium arsenide and gallium-aluminum arsenide, it is to be understood that the present invention is equal applicable to three or more semiconductor materials having different forbidden bandwidths. Also the present invention is equally applicable to the conductivity type reversed from that illustrated.

What we claim is:

1. A semiconductor injection laser device comprising an electrically high resistivity semiconductor substrate including a main face, a first, a second and a third semiconductor layer successively formed on a predetermined portion of said main face of said high resistivity substrate, and a fourth semiconductor layer disposed on the remaining portion of said main face of said semiconductor substrate to contact said first, second and third semiconductor layers, said fourth semiconductor layer being substantially flush with said third semiconductor layer and extending into said semiconductor substrate, said fourth semiconductor layer having a first type conductivity, at least the second layer consisting of a pair of semiconductor regions having the first type conductivity and a second type conductivity respectively to form therebetween a pn junction serving as a light emitting region, said semiconductor region of said first type conductivity contacting said fourth semiconductor layer, said second semiconductor layer having a forbidden band-width narrower than forbidden band-widths of said first, third and fourth semiconductor layers.

2. A semiconductor injection laser device as claimed in claim 1 wherein, said first, third and foruth semiconductor layers are formed of n type gallium-aluminum arsenide, and said second semiconductor layer is formed of n type gallium arsenide.

3. A semiconductor injection laser device as claimed in claim 1 wherein said semiconductor substrate is formed of high resistivity gallium arsenide doped with chromium.

4. A semiconductor injection laser device as claimed in claims 1, 2 or 3 wherein said first, second, third and fourth semiconductor layers are formed according to an epitaxial growth technique.

5. A semiconductor injection laser device as claimed in claim 2 wherein a pair of first and second electrodes are disposed in ohmic contact with individual gallium arsenide layers formed on said third and fourth semiconductor layers, respectively.

* * * * *